United States Patent
Stalmans et al.

(10) Patent No.: US 6,683,367 B1
(45) Date of Patent: Jan. 27, 2004

(54) THIN-FILM OPTO-ELECTRONIC DEVICE AND A METHOD OF MAKING IT

(75) Inventors: Lieven Stalmans, Lommel (BE); Jef Poortmans, Leuven (BE); Matty Caymax, Leuven (BE); Khalid Said, Leuven (BE); Johan Nijs, Linden-Lubbeek (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 09/743,076

(22) PCT Filed: Jul. 2, 1999

(86) PCT No.: PCT/BE99/00085

§ 371 (c)(1),
(2), (4) Date: Apr. 9, 2001

(87) PCT Pub. No.: WO00/02259

PCT Pub. Date: Jan. 13, 2000

Related U.S. Application Data

(60) Provisional application No. 60/093,352, filed on Jul. 20, 1998.

(30) Foreign Application Priority Data

Jul. 3, 1998 (EP) .............................. 98870147

(51) Int. Cl.[7] .............................................. H01L 29/06
(52) U.S. Cl. ....................................................... 257/618
(58) Field of Search ......................................... 257/618

(56) References Cited

U.S. PATENT DOCUMENTS

| | | |
|---|---|---|
| 4,806,996 A | 2/1989 | Luryi |
| 4,818,337 A | 4/1989 | Barnett et al. |
| 5,136,351 A | 8/1992 | Inoue et al. |
| 5,397,429 A | 3/1995 | Hummel et al. |
| 5,679,475 A * | 10/1997 | Yamagata et al. ........... 428/698 |
| 5,981,400 A * | 11/1999 | Lo ............................... 438/745 |
| 6,194,245 B1 * | 2/2001 | Tayanaka ..................... 438/57 |

FOREIGN PATENT DOCUMENTS

| | | |
|---|---|---|
| DE | 43 19 413 A1 | 12/1994 |
| DE | 197 43 692 A1 | 4/1999 |
| EP | 341 017 A2 | 5/1989 |
| JP | 63182811 | 7/1988 |
| JP | 03042818 | 2/1991 |
| JP | 03235371 | 10/1991 |
| JP | 06163968 | 6/1994 |

OTHER PUBLICATIONS

Grigoras et al., *Enhanced light absorption in anodically etched silicon wafers*, Elsevier Science S.A., 276, pp. 228–230 (1996).

Mauk et al., *Thin Siicon solar cells with internal reflection and their fabrication by solution growth*, IEEE, pp. 192–197, (1985).

Vernon et al., *High Performance porous silicon solar cell development*, IEEE, pp. 1583–1586 (1994).

Zettner et al., *Novel porous silicon backside light reflector for thin silicon solar cells*, Prog. Photovol. Res. 6, pp. 423–432 (1998).

* cited by examiner

Primary Examiner—Ngân V. Ngô
(74) Attorney, Agent, or Firm—Knobbe, Martens, Olson & Bear LLP

(57) ABSTRACT

The present invention is related to a thin-film opto-electronic device and a method of fabricating the same. Particularly this thin film opto-electronic device is fabricated on a Si-containing substrate. The thin-film material is a crystalline semiconductor material. In order to increase the efficiency of this device a porous silicon layer is applied between the thin-film and the substrate. This porous silicon layer has both light reflecting and light diffusing properties thereby giving rise to light confinement in the thin-film.

32 Claims, 4 Drawing Sheets

Figure 1
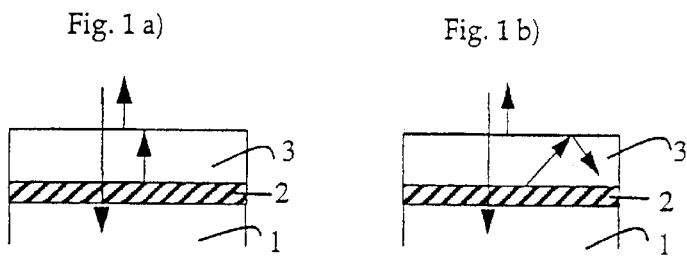
Fig. 1 a)   Fig. 1 b)
Figure 2
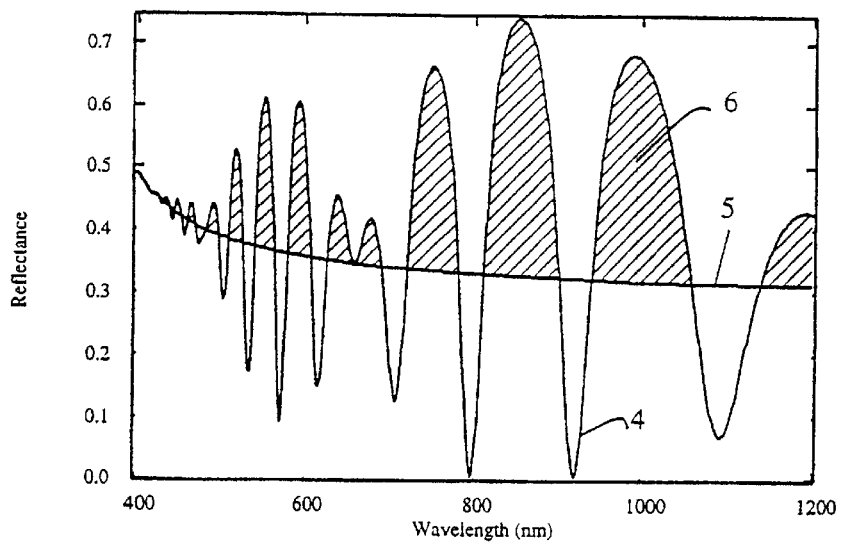
Figure 3
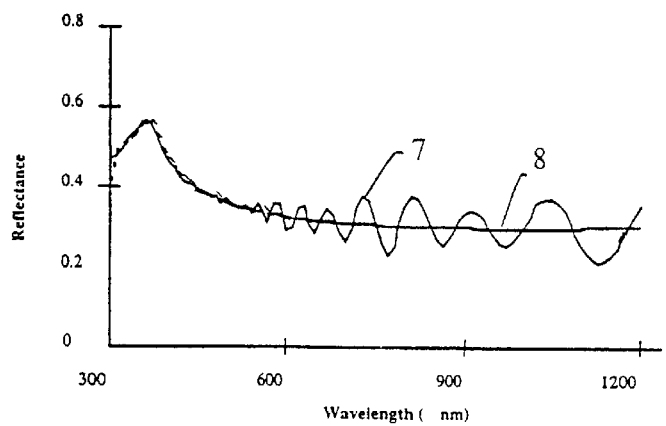

Figure 4
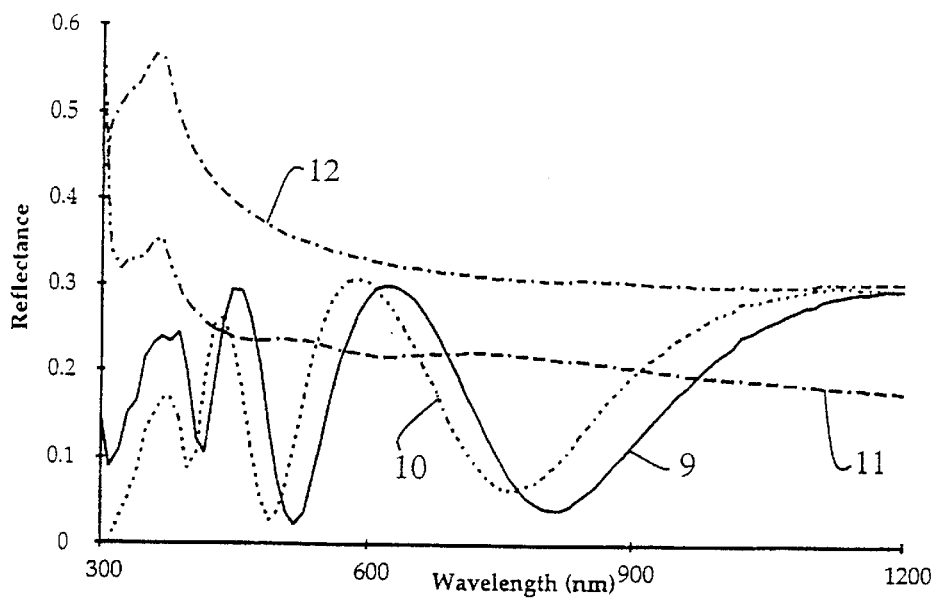
Figure 5
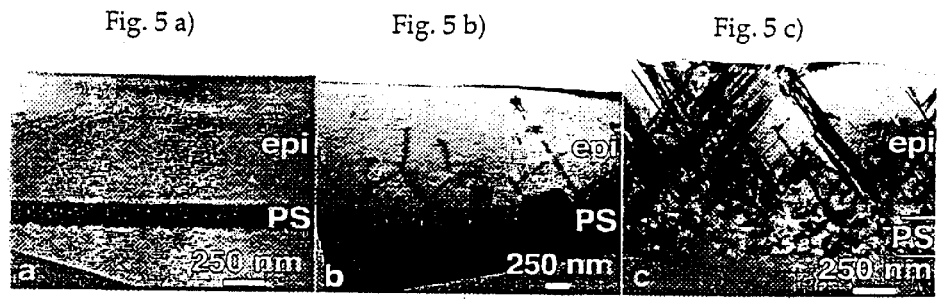
Fig. 5 a)   Fig. 5 b)   Fig. 5 c)
Figure 6
| Temperature (°C) | CVD on Si (nm/min) | CVD on PS (nm/min) |
|---|---|---|
| 725 °C | 4 - 8 | 11 |
| 800 °C | 60 - 100 | 100 |
| 850 °C | 200 | |

THIN-FILM OPTO-ELECTRONIC DEVICE AND A METHOD OF MAKING IT

This application claims the benefit of provisional application No. 60/093,352 filed Jul. 20, 1998.

FIELD OF THE INVENTION

The present invention is related to an efficient thin-film opto-electronic device on a low-cost Si-containing substrate. of particular interest are opto-electronic devices like solar cells and LED's.

BACKGROUND OF THE INVENTION

When analysing the technology progress on solar cells, being one of the opto-electronic devices under consideration, one can observe that an important research effort has been put in the development of solar cells in thin crystalline Si-based layers deposited on Si-containing substrates. It is a common feeling that this technical field remains important towards the future and carries a long-term economical importance. However, thin-film solar cell structures on a Si-containing substrate suffer from an intrinsic lack of light confinement. To assure a sufficiently high efficiency, one has to succeed to increase the light confinement into the thin film and at the same time avoid absorption losses into the substrate. The solution of this problem provides a major opportunity for advances in the efficiency of crystalline Si-based solar cells. Particularly, by collecting and confining the incident light in a small material volume, diffusion length requirements for efficient charge collection are relaxed and the thickness of the active layer in the silicon solar cell can be drastically reduced.

Several solutions have been proposed to introduce or improve light confinement. However all these different solutions have in common that the thin-film material quality is reduced and/or the complexity of the fabrication Process increases. Some of these solutions are:

a) grooving or texturing of the substrate prior to the thin-film deposition (as e.g. in U.S. Pat. No. 4,571,448). This has only limited beneficial results. The first pass of the incoming light is increased but there is no back reflection. Moreover, this solution has a negative influence on the complexity of the fabrication process.

b) deposition of the thin-film on a substrate which has an intermediate oxide layer acting as backside reflector. However, the use of such an oxide implies a lower quality of the deposited material and is technologically complicated.

c) a substrate etch-back can be performed to thin the substrate in order to be able to use the backside of the substrate as a reflector. Such an etch-back process leads to a severely decreased mechanical stability, which is also undesirable.

Independently in another technical field, research is carried out on epitaxial growth on porous Si. An interesting observation is that it is possible to obtain high-quality thin films when depositing Si on a porous Si surface. This has resulted mainly in using this technique for silicon-on-insulator (SOI) applications. For these applications the porous layer is a disposable layer since the porous layer is removed afterwards as e.g. in the United States patent U.S. Pat. No. 5,536,361.

Recently epitaxial growth on porous Si has been applied also in the field of solar cells as in R. Brendel, "A novel process for ultra-thin monocrystalline silicon solar cells on glass", 14th European PV-Conference, Barcelona 1997, pp. 1354–1357. Here, a Si-film is grown on porous Si and transferred afterwards onto another substrate, i.e. a glass substrate. As in the SOI-application, the grown porous Si layer is a disposable layer.

Documents DE-4319413, U.S. Pat. No. 5,696,629 and WO-A-94/29757 disclose an optical component including a multilayer stack of porous silicon layers grown on a silicon substrate. The multilayer stack is serving as a detector, an interference filter or a reflector.

The document JP-02031204 discloses a method for making a III–V group semiconductor solar battery on a silicon substrate. In order to achieve a higher photoelectric conversion efficiency of this solar battery, the surface of the silicon substrate is made porous prior to the growth of the III–V group semiconductor. The higher photoelectric conversion efficiency is achieved by having less transposition, residual stress and lattice defects in the III–V group semiconductor.

AIMS OF THE INVENTION

An aim of the invention is to achieve light confinement in a crystalline thin-film opto-electronic device being formed on a Si-containing substrate in order to increase the efficiency of this device. Typical thin-film materials are Si, Ge, SiGe and other III–V compound materials.

It is a further aim of the invention to achieve this light confinement without a substantial deterioration of the thin-film material quality and without substantially increasing the process complexity.

SUMMARY OF THE INVENTION

In an aspect of the invention a thin-film opto-electronic device on a Si-containing substrate is disclosed. Particularly, this thin film is a crystalline semiconductor layer. The thin film can be for instance single-crystalline or polycrystalline. In order to increase the efficiency of this device a porous layer is applied between the thin-film and the substrate. This porous, preferably silicon, layer has both light reflecting and light diffusing properties thereby giving rise to light confinement in the thin-film. Besides the optical benefits, the porous layer can also act as a barrier layer, which prevents diffusion of impurities from a substrate into the deposited semiconductor layer. This is advantageous especially in the case of low-cost and therefore impure substrates. This barrier layer activity is due to gettering of impurities at the large internal porous surface, but can be a result of other phenomena as well.

Particularly, a thin-film opto-electronic device on a conductive silicon-containing substrate is disclosed comprising:
  a porous silicon layer on said substrate, said porous silicon layer having both light diffusing and light reflecting properties;
  a non-porous layer on said porous silicon layer; and
  at least one first region and at least one second region in said non-porous layer, said first region of a first conductivity type preferably acting as a light absorber, said second region having a conductivity of a second type, different from said first conductivity type, for contacting said thin-film opto-electronic device.

Preferably, said non-porous layer is a non-porous semiconductor layer.

According to one preferred embodiment, said non-porous semiconductor can be a crystalline layer.

According to a second embodiment, said non-porous semiconductor layer can be an elemental layer.

According to a third embodiment, said non-porous semiconductor layer can be made of an element of group IV.

Preferably, said device comprises at least three regions:
a first region of a first conductivity type and having a doping level,
a second region of a second conductivity type within said region, and
a third region of said first conductivity type and being of a higher doping level than the doping level of said first region, said third region not abutting said second region.

Preferably, said porous layer has a gradually changing porosity from on place, preferably the bottom of the layer, to another place, preferably the top of the layer. Said porous layer can also contain a plurality of porous layers with a different porosity.

According to a preferred embodiment, said device can further have a second layer of a porous medium in/or on said non-porous layer.

Said second layer can be a porous silicon layer or a porous dielectric layer.

Said porous dielectric layer can be a silicon nitride layers.

The present invention is also related to the use of a sequence of layers as described hereabove for making a thin film opto-electronic device on a conductive silicon-containing substrate wherein optical confinement is realised.

In a preferred embodiment of the invention, the porous Si layer has a thickness in the range from 0.1 $\mu$m to 1 $\mu$m. The porosity has a value typically between 20% and 70%. This porosity can be tuned dependent on the desired performance being the overall efficiency of the device. An Increase in porosity yields a better light confinement being beneficial for the efficiency but a decrease in the semiconductor layer material quality being detrimental for the efficiency. Furthermore the porosity can be influenced by the subsequent heat treatments as e.g. during the formation of the semiconductor layer. Particularly if temperatures above about 750° C. are applied, volatilisation and coarsening can occur in the porous silicon layer. Examples of semiconductor layers are layers of silicon, Ge, SiGe or other III–V compound materials.

In another embodiment of the invention, the porous silicon layer comprises porous silicon parts and columnar conductive parts, said columnar conductive parts forming conductive connections between the substrate and the semiconductor layer. Particularly, these columnar conductive carts form conductive connections between the substrate and the first region of the semiconductor layer; said substrate having the same conductivity type as said first region, being either n-type or p-type, and said substrate being provided with a contact. The substrate is preferably a highly doped silicon substrate. The columnar parts can also be advantageous to achieve a better crystallinity of the semiconductor layer by providing crystalline growth nuclei.

In another aspect of the invention, a method for fabricating a thin-film opto-electronic device on a conductive silicon-containing substrate is disclosed, comprising the steps of:
a) forming a porous silicon layer on said substrate such that said porous silicon layer acts as a light diffuser and as a Light reflector;
b) growing a non-porous layer, preferably a crystalline layer, on said porous silicon layer, said non-porous layer comprising at least one first region and at least one second region being formed in said non-porous layer, said first region of a first conductivity type acting as a light absorber, said second region of a second conductivity type, different from said first conductivity type, for contacting said thin-film opto-electronic device.

The quality of the non-porous layer grown depends on both the porosity of the initial porous layer and the growth temperature. Particularly if temperatures above about 750° C. are applied, volatilisation and coarsening can occur in the porous silicon layer.

In another embodiment of the invention, the porosity of the initial porous layer is in the range from 20% to 70%, while the temperature during the subsequent growing step is preferably below about 750° C. The porous silicon layer can be formed by exposing the substrate to an electrochemical treatment or a chemical treatment or spark erosion.

In another embodiment of the invention, the porous Si layer is formed by an electrochemical treatment, particularly, by electrochemical anodisation, e.g. in a HF-based electrolyte. The obtained thickness of the porous silicon layer depends on the anodisation time and is typically in the range from 0.1 $\mu$m to 1 $\mu$m. The substrate is preferably a highly doped Si substrate having either a n-type or a p-type conductivity. The porous silicon layer formed can comprise porous silicon parts and columnar conductive parts, said columnar conductive parts forming conductive connections between the substrate and the first region of the non-porous layer; said substrate and said first region having the same conductivity type.

In another embodiment of the invention, prior to the formation of the porous silicon layer a patterned mask layer is formed on the substrate to thereby define at least one first area and at least one second area in the substrate, said first area being uncovered, said second area being covered with said mask layer; thereafter said porous silicon layer is formed on said first area and said mask layer is removed from said second area; thereafter a non-porous layer is grown on said second area and on said porous silicon layer thereby creating said columnar conductive parts.

In another embodiment of the invention a method is disclosed wherein the non-porous layer is a Si or a Ge or a SiGe or a III–V compound layer being grown by means of chemical vapour deposition or physical vapour deposition or molecular beam epitaxy.

In another embodiment of the invention a method is disclosed wherein the substrate is not used for contacting the device. Particularly, the substrate can be lowly doped or not doped and/or isolated from the semiconductor layer. Instead, according to this method, at least one third region is formed in said first region for contacting said first region, said third region being isolated from said second region and having the same conductivity type as said first region.

BRIEF DESCRIPTION OF THE DRAWINGS

FIG. 1 depicts a Si/porous-Si/Si multilayer structure according to an embodiment of the invention. The structure comprises a Si substrate (1), a Si semiconductor layer (3) and a porous Si layer (2) between the substrate and the semiconductor layer. In FIG. 1a) the porous layer has only light reflecting properties, while in FIG. 1b) the porous layer has both light reflecting and light diffusing properties.

FIG. 2 depicts simulated reflectance data versus the wavelength. These simulation data are obtained from a specular simulation where the porous silicon layer only acts as a reflector and not as a diffuser. Observed is a clear interference pattern (4) and a total reflectance for the multilayer structure (as in FIG. 1a)) which is larger than the reflectance of a pure Si substrate (5) (without porous Si layer), as indicated by the larger part of the reflectance curve situated above the Si-reflectance curve (dashed area) (6).

FIG. 3 depicts, according to an embodiment of the invention, measured reflectance data versus the wavelength.

The measurement data (7) of the multilayer structure as depicted in FIG. 1 as well as the Si reflectance curve (8) are presented.

FIG. 4 depicts, according to an embodiment of the invention, measurement data of the reflectance of the porous silicon layer for different heat treatments.

FIG. 5 depicts XTEM-pictures of a Si-porous Si-Si multilayer structure where the deposition of the Si semiconductor layer on top of the porous Si layer was performed using CVD at various temperatures and at different values of the porosity.

In FIG. 5a) the deposition is performed at 725° C. with an initial porosity of 20%.

In FIG. 5b) he deposition is performed at 725 ° C. with an initial porosity of 60%.

In FIG. 5c) the deposition is performed at 800° C. with an initial porosity of 60%.

Figure 7:
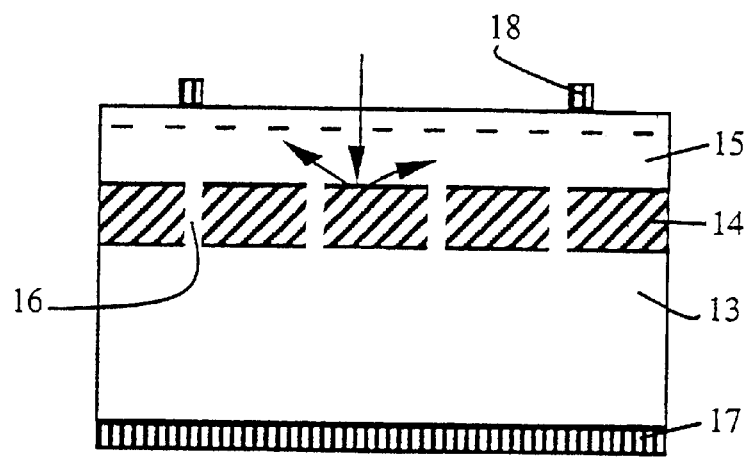

FIG. 6 presents, according to an embodiment of the invention, a table of some Si-deposition rates (using DCS as a source) on PS and on Si FIG. 7 depicts a cross-section of a solar cell, according to an embodiment of the invention.

Figure 8:
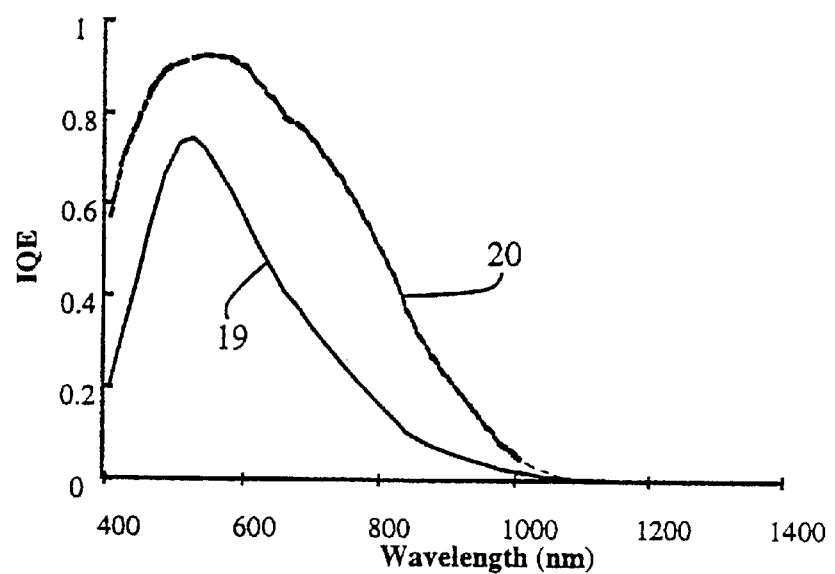

FIG. 8 depicts both measured data of the IQE of the solar cell depicted in FIG. 7 and according to an embodiment of the invention, i.e. the realised epi-on-porous-silicon (19) cell as well as measurement data of a similar epi-on-Si solar cell (20) (without porous layer)

Figure 9:
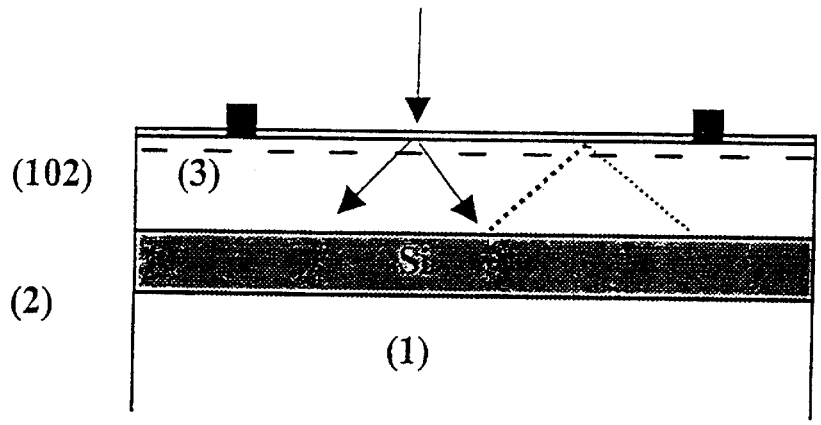

FIG. 9 is a schematic representation of the presence of a front surface diffuser according to a preferred embodiment of the present invention.

Figure 10:
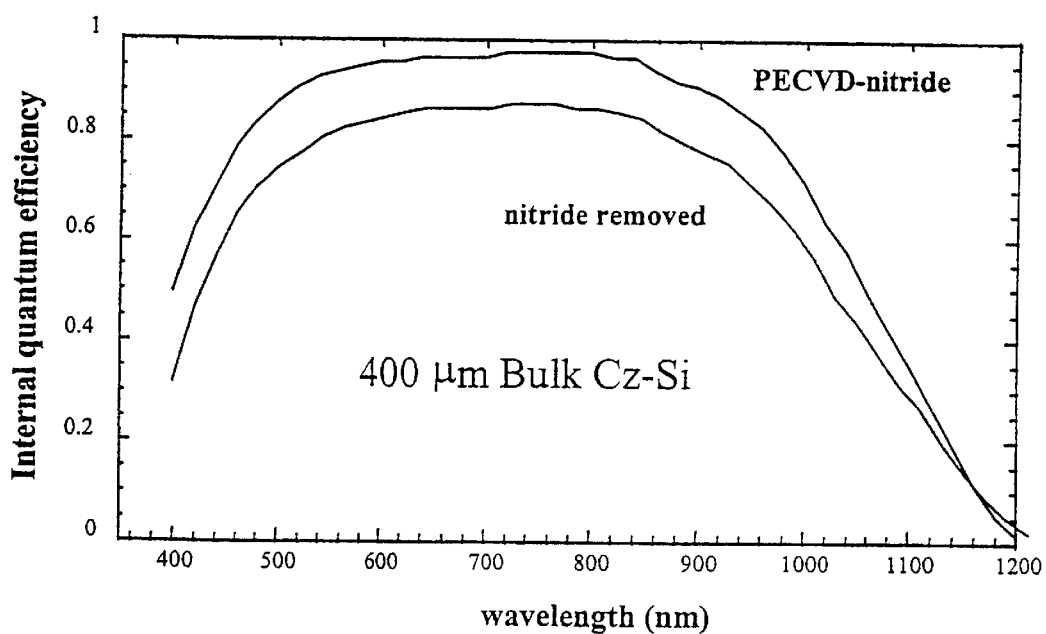

FIG. 10 shows a IQE-analysis revealing an increased response of a device according to a preferred embodiment of the present invention when a porous nitride surface layer is present.

DETAILED DESCRIPTION OF THE INVENTION

In relation to the appended drawings the present invention is described in detail in the sequel. It is apparent however that a person skilled in the art can imagine several other equivalent embodiments or other ways of executing the present invention, the spirit and scope of the present invention being limited only by the terms of the appended claims.

According to an embodiment of the invention, a porous silicon layer is incorporated in a thin-film opto-electronic device thereby giving rise to light confinement in the thin-film. To achieve a greater impact on the efficiency of this opto-electronic device, this porous silicon layer has to have both light reflecting and light diffusing properties. Besides the optical benefits, the porous layer can also act as a barrier layer, which prevents diffusion of impurities from a substrate into the deposited semiconductor layer. This is advantageous especially in the case of low-cost and therefore impure substrates. This barrier layer activity is due to gettering of impurities at the large internal porous surface, but can be a result of other phenomena as well.

The gettering function of this porous layer is more effective in case that the porous layer is made as an uninterrupted layer. In such case an advantageous embodiment of the present invention includes an opto-electronic device on a conductive silicon-containing substrate, said device including a sequence of layers, said layers comprising at least:
  a layer of a porous medium, preferably porous silicon, on said substrate, said porous layer having both light diffusing and light reflecting properties;
  a non-porous layer on said porous layer, wherein at least three regions are created:
    a first region of a first conductivity type and having a doping level,
    a second region of a second conductivity type within said region, and
    a third region of said first conductivity type and being of a higher doping level than the doping level of said first region, said third region not abutting said second region.

Such device in an exemplary embodiment can be made as follows. A continuous porous layer is made on a silicon substrate according to one of the techniques described here below. A crystalline silicon layer is deposited or epitaxially grown on the porous silicon layer. This crystalline semiconductor can be doped to a level of the order of $5 \times 10^{16}/cm^3$ p-type (boron) or n-type (phosphorous) dopants by a diffusion technique. This is a medium doping level that also can be achieved while depositing or growing the crystalline silicon layer on the porous silico layer. This medium doping level provides a first region of a first conductivity type in the crystalline silicon layer. Highly doped regions (doping level of the order of $10^{18}$–$10^{19}/cm^3$ or higher) are fabricated by diffusion in this first region.

A second region of the opposite conductivity type as the first region and a third region of the same conductivity type as the first region are made is this way. With the air of optical lithography techniques, it is realised that the second and the third regions are separated one from another. The second and third regions are enveloped within said first region.

To evaluate the optical properties of the porous silicon layer, as an example, a comparison is made between simulated and measured reflectance characteristics of a typical multilayer structure (FIG. 1) comprising a Si substrate (1), a Si semiconductor layer (3) and a porous Si layer (2) between the substrate and the semiconductor layer. If the porous layer scatters the reflected light (FIG. 1b)), i.e. acts at the same time as a light reflector and as a light, diffuser, a large part of the light returns at the surface of the semiconductor layer outside the escape cone and therefore remains inside the Si semiconductor layer, giving rise to a lower total reflectance as compared to a specular simulation (FIG. 1a)) where the porous silicon layer acts only as a light reflector and give rise mainly to a coupling out of the reflected light at the front surface. In FIG. 2 simulation data are shown, using the layer thickness as derived from XTEM. These simulation data are obtained from a specular simulation where the porous silicon layer only acts as a reflector and not as a diffuser. Observed is a clear interference pattern (4) and a total reflectance for the multilayer structure which is larger than the reflectance of a pure Si substrate (5) (without porous Si layer), as indicated by the larger part of the reflectance curve situated above the Si-reflectance curve (dashed area) (6).

These simulated data are to be compared with measured curves as depicted in FIG. 3. In the measured case interference is observed as well, which indicates that the porous layer remains present (FIG. 3) and affects the reflectance characteristic. However the real situation (7) differs from the simulated one with respect to the total reflectance which is smaller as compared to the simulated case since the area of the total reflectance above and below the Si reflectance curve is comparable. In other words the light is confined in the semiconductor layer and therefore it is clear that the porous Si layer also acts as a light diffuser. The measured total ('average') reflectance approaches the Si-reflectance (8) which is the lower-limit corresponding to the situation where only the light from the first air-Si reflection is measured.

The methodology used for the specular simulations explaining the optical confinement of the invention is explained herebelow.

FIG. 2 depicts the specularly simulated reflectance of a Si-surface and of a epi-on-porous Si structure, assuming a remaining porosity of 60%. As stated hereabove, in FIG. 3, the measured reflectance of the epi-on-porous Si structure is shown. The specular reflectance of the different layer structures is calculated from the general Fresnel equations that are well known by the person skilled in the art (E. D. Palik, "Handbook of optical constants of solids", Book published by Academic Press, pp. 18–34 (1985)). The specular reflectance calculations are performed using the IMEC-developed "Multilayer$_{13}$ Pro" software, which is based on these Fresnel equations. The calculations do not take account of the absorption or the refractive index dispersion with respect to the wavelength related to the porous silicon layer.

The 400–1200 nm average reflectance for the epi-on-porous silicon structure is larger than the Si-reflectance (32.0%) in both the simulated (40.7%) and measured (32.6%) cases. This is understood from the light reflection at the buried porous layer, which results in an additional reflectance component. The average reflectance is the highest when simulating an intermediate porous layer of 60% porosity (43.7% reflectance), since the reflectivity increases when the intermediate medium optically differs from Si more strongly.

The measured reflectance (FIG. 3) exhibits a strongly reduced amplitude of the interference oscillations as compared to the simulated reflectance behaviour. In the short-wavelength region the amplitude might be lowered partially due to light absorption that occurs within the buried porous layer, which is not taken into account in the simulations, but the lowering of the amplitude is present over the whole wavelength range. The decreased amplitude and the fact that the average reflectance is lower as compared to the specular simulation can be interpreted as originating from a diffuse reflectance of the light at the intermediate porous layer, which would result in light trapping. However the reduced amplitude of the oscillations in the measured reflectance might suggest as well that during the epitaxial growth the porosity is lowered, which makes that the optical difference between Si and the buried porous layer is reduced. The measured reflectance in case of an epi-layer on a porous layer with an initial porosity of 60% can be approached more closely when simulating the structure with a remaining porosity of 20% only. Hence the lowering of the interference oscillations amplitude can be correlated to the pore-filling effect for which also independent evidence exists from Rutherford Backscattering analysis. In the case of a reduced porosity of only 20% after the epi-growth, a diffuse reflectance of around 10% on the porous silicon layer (at a wavelength of 800 nm) is calculated from the random medium model. A random medium model for light propagation in porous Si is based on the theory of wave propagation in random media and is applied to describe the separate specular and diffuse reflectance components of structures consisting of a thin Si film on top of porous Si.

In another embodiment of the invention, as an example, a particular opto-electronic device, i.e. a solar cell (FIG. 7) and the detailed process flow to fabricate that opto-electronic device according to the method of the present invention is considered. The starting material is a Si-containing substrate (13). According to this example, a highly doped p-type conductivity six inch silicon wafer is chosen with an epitaxial Si layer of 10 $\mu$m on top. This epitaxial layer has also a p-type conductivity at a level of $8 \times 10^{18}/cm^3$.

Further according to the example, prior to the formation of a porous silicon layer a patterned mask layer is formed on the substrate, i.e. on the epitaxial layer, to thereby define at least one first area and at least one second area in the substrate. This first area is uncovered, while the second area is covered with the mask layer. Particularly, a nitride layer is used as a mask layer. In fact, first the six inch wafers were diced because for this particular experiment the maximum area was limited because of the size requirements for the porous Si formation. Particularly, squares with an area of 5 cm by 5 cm are created. Further processing is performed on these squares. A nitride layer having a thickness of 500 nm is deposited. In order to pattern this nitride layer, first a resist layer is deposited on the nitride layer. This resist layer is patterned by a sequence of at least a lithographic and a development step. Then the uncovered areas of the nitride layer are removed by means of a buffered HF step for 11 minutes. Thereafter, the remaining of the resist layer is removed using a acetone/IPA based rinse step.

In the next step of the example, a porous Si layer (14) is formed on the uncovered areas. A small portion of the substrate, i.e. the covered areas being about 4%, of the substrate is not converted into porous Si to provide conductive connections which allow the use of a cell structure with a back contact. This can e.g. be done by an electrochemical treatment or a chemical treatment or spark erosion. Particularly, the porous layer is formed by electrochemical anodisation in a HF-based electrolyte. The anodisation time is adjusted to obtain a layer thickness of approximately 350 nm. In fact a 15 seconds anodisation is performed in an electrolyte comprising HF (50%), H$_2$O and ethanol at a ratio of 1:1:2. Finally, the nitride is removed from the second areas.

If an electrochemical anodisation is used and/or if one wants to make contact to the opto-electronic device via the substrate, preferably highly doped Si substrates, are used as e.g. in the example. At first, if a highly doped substrate is used, then no backside metal contact is required for the anodisation. The presence of metal can be incompatible with the subsequent growth process of the semiconductor layer, especially in case this growth is performed using a chemical vapour deposition technique (CVD). Secondly, the formation of a porous Si layer on a highly doped material results in mesoporous Si which is the preferred type of porous material for the subsequent CVD-growth in view of the epitaxial quality of the grown semiconductor layer.

Further according to the example, a semiconductor layer (15) is grown on said second area and on said porous silicon layer thereby creating columnar conductive parts (16) in the porous Si layer between the grown semiconductor layer and the substrate. Particularly, first the surface of the porous Si layer is pre-treated by an exposure to a 2% HF-based solution during 15 seconds followed by a short rinse in diluted water. Then, a crystalline semiconductor layer, i.e. a Si layer, is grown on the porous Si layer in an Epsilon-One tool, which is a commercially available single wafer chemical vapour deposition (CVD) epitaxial reactor manufactured by ASM Epitaxy. It consists of a horizontal, lamp heated quartz chamber with a SiC coated graphite susceptor. Load locks and very clean gases allow to grow high quality epitaxial monocrystalline and polycrystalline material in a wide range of temperatures. The reactor is operated at a reduced pressure (RP), typically 40 torr. SiH$_2$Cl$_2$ (DCS) is used as Si source gas, which is diluted in a flow of H$_2$ as carrier gas.

The temperature according to the example is 800° C. The time between the porous Si formation and the loading into the CVD-system is kept as short as possible to avoid ageing. The growth process is a single step process. In the first chase of the growth process the first region is formed. This first region, being the absorber region has a p-type conductivity and comprises a first and a second sub-layer. The first sub-layer has a thickness of 0.5 µm and an impurity level of $3 \times 10^{19}/cm^3$ and is merely introduced to act as an electrical back-surface-field. The absorption mainly takes place in the second sub-layer having a thickness of 2 µm and an impurity level of $1 \times 10^{16}/cm^3$. In the second phase of the growth process the second region is introduced with a n-type conductivity for contacting the solar cell. This second region has a thickness of 0.3 µm and an impurity level of $3 \times 10^{19}/cm^3$.

A number of heating cycles (FIG. 4) is performed in order to assess the effects of the heat treatment, during growth of the semiconductor layer, on the properties of the porous Si layer formed. The porous Si reflectance (9), which is strongly dependent on the structural characteristics of the porous Si layer, remains virtually unaltered after a thermal anneal in $H_2$-environment up to 725° C. (10). At higher temperatures however, coarsening of the porous layer occurs and the porous layer is volatilised in the strongly reducing ambient. As a result, the typical interference pattern in the reflectance disappears and the reflectance (11) is uniformly lowered compared to the Si-reflectance (12) due to the roughened surface. The coarsening and volatilisation of the porous layer during a heat treatment are two distinct phenomena. An important issue herein is whether the porous layer is in direct contact with the $H_2$-ambient. An experiment in which a porous layer is subjected to a heat treatment, a deposition, or a combined deposition and heat treatment, reveals that coarsening is present in all cases but that volatilisation only occurs during heating since in both other cases the porous layer is covered by a protecting Si-cap. Furthermore heating tests on porous layers in an argon-ambient do not reveal any change in reflectance up to 1000° C., which also points to the detrimental role of $H_2$ on the porosity during annealing especially at elevated temperatures. Therefore, preferably the use of $H_2$ as a carrier gas is avoided or in case $H_2$ is in the ambient temperatures below 750° C. are recommended.

Crystalline silicon is obtained when applying thermal CVD on a porous surface layer. The epitaxial quality however depends on both the porosity of the initial porous Si layer and the deposition temperature (FIG. 5). When depositing at 725° C., an increase of the initial porosity from 20% (FIG. 5a)) to 60% (FIG. 5b)) increases the number of crystallographic defects. The defect density further increases when the deposition temperature is increased. An increase of the deposition temperature to 800° C. e.g. for the layer with an initial porosity of 60% results in strongly defected Si (FIG. 5c)). Further analysis (FIG. 6) of the deposited Si-layer thickness (using XTEM) reveals that the CVD-deposition rates on porous Si (PS) are comparable to the values obtained on Si. This is expected since the reflectance of a Si-on-porous-Si structure quickly evolves to the Si-reflectance. Hence no additional light absorption (which might increase the material temperature) occurs. Furthermore the values for the heat conductivity of porous Si which have been reported in literature, e.g. in V. Lysenko et al., "Heat transfer in porous silicon", 1st Porous Semiconductors-Science & Technology Conference, Mallorca pp. 105–106 (Meeting Abstracts) (1998), for mesoporous Si, i.e. ~80–100 W/mK, are close to the value reported for Si 148 W/mK. Therefore any temperature difference within the opto-electronic device will be quickly balanced.

According to the example a temperature of 800° C. is combined with an ambient comprising $H_2$, the porous layer is still intact but the grown Si semiconductor layer is heavily defected which negatively influences the cell performance.

Further according to the example (FIG. 7), after the growth of the Si semiconductor layer comprising multiple sub-layers, an Al metal contact (17) is formed at the back-side of the substrate by evaporation. A low-temperature bulk- and surface-passivation scheme consisting of a plasma-hydrogenation for bulk passivation and a remote-plasma nitride deposition for surface passivation is applied. Followed by a sintering step and the formation of a multi-layer metal pattern (18), i.e. 80 nm Ti, 50 nm Pd—and 5 µm Ag, on front side of the substrate.

Some of the characteristics of the solar cell formed in the example are presented. For comparison a similar solar cell is formed on a monocrystalline Si substrate as well (without porous Si layer). However no fundamental comparison is possible on the level of cell performance because of the applied CVD conditions in the example yielding strongly defected Si in the porous silicon case. (The temperature was too high or one had to omit the hydrogen.) FIG. 8 shows the IQE of the realised epi-on-porous-silicon (19) and epi-on-Si solar cells (20). The low over-all response for the epi-on-PS cell (19) is due to a low bulk diffusion length being a consequence of the large defect density as is clearly pointed out by dark current analysis. Furthermore, simulations of the epi-on Si cell coincide with the measurements, whereas there is a misfit of about 22% in short-circuit current between the measurements and the simulations of the epi-on-porous-Si cell. This misfit is attributed to an increased optical absorption due to light confinement within the thin Si-film on top of the porous layer. This is a clear indication that the porous Si layer acts at the same time as a reflector and as a diffuser. Improving the quality of the epitaxially-crown Si will definitely lead to a cell structure with a better performance. Also lower and higher deposition temperatures can be used. Temperatures can range from 4000° C. until 1200° C. At lower temperatures (400/450–800° C.) use is made of plasma-assisted deposition methods with an optimal temperature range of 600–800° C., and preferably 700–750° C. At higher temperatures (800–1200° C.) use is made of thermal CVD deposition methods within an optimal temperature range of 1000–1100° C.

Other embodiments of the invention can be made as well. At a place in the non-porous layer (3) or on top of the non-porous layer (3) on said porous silicon layer (2), a layer (102) of the same or another porous. medium, preferably a dielectric medium, can be applied.

This latter layer randomises or diffuses the incoming light. As a result, the light enters the active semiconductor layer (3) in a diffuse way. This is beneficial from the viewpoint of an enhanced optical path length during the first pass through the semiconductor layer (3). Additionally, the reflectance at the porous layer on the substrate increases when the light arrives in an oblique way.

This porous medium top layer can consist of a nitride layer that is obtained by low-temperature (for instance 150–350° C.) plasma-enhanced deposition. It can also be the result of a porous etching of the upper surface of the active semiconductor layer. The layer of porous medium can also be present in the semiconductor layer.

According to another embodiment, a porous layer (2) having a different top and bottom porosity can be fabricated while continuously changing the etching conditions during the formation. Such a graded porous silicon layer structure is favourable since the lower top porosity allows to deposit a high-quality epitaxial semiconductor layer (3), while the higher bulk porosity ensures that the porous layer exhibits a sufficiently strong light diffusing and light reflecting behaviour.

What is claimed is:

1. A thin-film opto-electronic device on a conductive substrate, said device including a sequence of layers, said layers comprising at least:
   a layer of a porous medium, on said substrate, said porous layer having a first porous layer with a first porosity and a second porous layer on said first porous layer, said second porous layer having a porosity that is different than the porosity of said first porous layer, said layer of a porous medium having both light diffusing and light reflecting properties;
   a non-porous layer on said layer of a porous medium, with at least one first region and at least one second region, said first region of a first conductivity type, said second region having a conductivity of a second type, different from said first conductivity type, said sequence of layers being such that optical confinement is realized in said device.

2. A device as recited in claim 1, wherein said porous medium is porous silicon.

3. A device as recited in claim 1, wherein said first region of first conductivity type is acting as a light-absorber.

4. A device as recited in claim 1, wherein said non-porous layer is a silicon-containing semiconductor layer.

5. A device as recited in claim 1, wherein said non-porous layer is a crystalline layer.

6. A device as recited in claim 1, wherein said layer of a porous medium has a porosity in the range from 20% to 60%.

7. A device as recited in claim 1, wherein said non-porous layer is a layer of a material selected from the IV group.

8. A device as recited in claim 7, wherein said non-porous layer is selected from the group comprising Si, SiGe and Ge.

9. A device as recited in claim 1, wherein said non-porous layer has a thickness in the range from 0.1 µm to 10 µm.

10. A device as recited in claim 1, wherein said non-porous layer comprises at least three regions:
    said first region of a first conductivity type and having a doping level;
    said at least one second regions of a second conductivity type within said first region; and
    a third region of said first conductivity type and being of a higher doping level than the doping level of said first region, said third region not abutting said at least one second region.

11. A device as recited in claim 1, wherein said layer of a porous medium has a thickness in the range from 0.1 µm to 1 µm.

12. A device as recited in claim 1, wherein said layer of a porous medium has a porosity in the range from 20% to 70%.

13. A device as recited in claim 1, wherein said layer of a porous medium has a gradually changing porosity.

14. A device as recited in claim 1 further having a third layer of a porous medium.

15. A device as recited in claim 1, wherein said third porous layer is a dielectric layer.

16. A device as recited in claim 15, wherein said third porous layer is a silicon nitride layer.

17. A device as recited in claim 1, wherein said layer of a porous medium comprises porous silicon parts and columnar parts, said columnar parts forming conductive connections between the substrate and the non-porous layer.

18. A device as recited in claim 17, wherein the parts are conductive to thereby form conductive connections between the substrate and the non-porous layer.

19. A device as recited in claim 17, wherein said columnar conductive parts form conductive connections between the substrate and the first region of the semiconductor layer; said substrate having the same conductivity type as said first region, being either n-type or p-type, and being provided with a contact.

20. A device as recited in claim 1, wherein the substrate is a highly doped silicon substrate.

21. A device as recited in claim 1, wherein contacts are provided on said first region of said thin-film opto-electronic device.

22. A device as recited in claim 1, wherein said device is a solar cell.

23. A thin film opto-electronic device on a conductive silicon-containing substrate, said device including a sequence of layers, said layers comprising at least:
    a layer of a porous semiconductor material on said substrate, the porosity of said layer of a porous semiconductor material varying from a first porosity in a portion adjacent to said substrate to a lower level of porosity in a portion not adjacent to said substrate, said layer of a porous semiconductor material having both light diffusing and light reflecting properties;
    a non-porous layer on said layer of a porous semiconductor material, with at least one first region and at least one second region, said first region of a first conductivity type, said second region having a conductivity of a second type, different from said first conductivity type; and
    a second layer of a porous medium on said non-porous layer opposite said layer of a porous semiconductor material and configured to diffuse light entering said non-porous layer,
    said sequence of layers being such that optical confinement is realized in said device.

24. A device as recited in claim 23, wherein said porous layer has a gradually changing porosity from one place, preferably the bottom of the layer, to another place, preferably the top of the layer.

25. A device as recited in claim 23, wherein said layer of a porous semiconductor material contains a plurality of porous layers with a different porosity.

26. A sequence of layers for making a thin-film opto-electronic device wherein optical confinement is being realized, said sequence of layers comprising at least:
    a substrate;
    a layer of a porous medium on a substrate, said porous layer having a top surface and a bottom surface adjacent said substrate, said porous layer having both light diffusing and light reflecting properties, wherein the porosity of said porous layer varies from said top surface to said bottom surface;
    a non-porous layer on said porous layer, having at least one first region and at least one second region, said first region of a first conductivity type acting as a light absorber, said second region having a conductivity of a second type, different from said first conductivity type.

27. The sequence of layers as recited in claim 26, wherein said porous medium is porous silicon.

28. The sequence of layers as recited in claim 26, wherein said non-porous layer is a silicon-containing semiconductor layer.

29. A device as recited in claim 1 further comprising a third layer of a porous medium in said non-porous layer.

30. A thin film opto-electronic device comprising:

a conductive silicon-containing substrate;

a non-porous layer having at least a first region of a first conductivity type and a second region located having a conductivity of a second type, different from said first conductivity type; and a porous silicon semi-conductor layer between said substrate and said non-porous layer, the porosity of said porous layer varying from a first level of porosity in a region in contact with the silicon substrate and to a second level of porosity in a region of said porous silicon semi-conductor layer adjacent said non-porous layer, said second level of porosity being lower than said first level of porosity.

31. The thin film opto-electronic device of claim 30 wherein said porous layer comprises a plurality of porous layers.

32. The thin film opto-electronic device of claim 30 wherein said non-porous layer comprises silicon.

* * * * *